(12) United States Patent
Fu et al.

(10) Patent No.: US 11,018,648 B1
(45) Date of Patent: May 25, 2021

(54) SONIC LOGGING BROADBAND IMPEDANCE MATCHING TRANSFORMER MODULAR DESIGN METHOD AND MODULE

(71) Applicant: Institute of Geology and Geophysics, Chinese Academy of Sciences, Beijing (CN)

(72) Inventors: Xin Fu, Beijing (CN); Yuntao Sun, Beijing (CN); Yang Gou, Beijing (CN); Wenxuan Chen, Beijing (CN); Fuqiang Wei, Beijing (CN)

(73) Assignee: INSTITUUTE OF GEOLOGY AND GEOPHYSICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 17/118,299

(22) Filed: Dec. 10, 2020

(30) Foreign Application Priority Data

Dec. 12, 2019 (CN) .......................... 201911275168.2

(51) Int. Cl.
*H03H 9/00* (2006.01)
*H01F 19/00* (2006.01)

(52) U.S. Cl.
CPC ........... *H03H 9/0004* (2013.01); *H01F 19/00* (2013.01)

(58) Field of Classification Search
CPC .............................. H03H 9/0004; H01F 19/00
(Continued)

(56) References Cited

U.S. PATENT DOCUMENTS

| 6,151,969 A | 11/2000 | Miller et al. |
| 2010/0200296 A1* | 8/2010 | Camwell ............. E21B 47/0224 175/50 |
| 2014/0160892 A1 | 6/2014 | Lee et al. |

FOREIGN PATENT DOCUMENTS

| CN | 102722613 A | 10/2012 |
| CN | 205563167 U | 9/2016 |
| CN | 108882108 A | 11/2018 |

OTHER PUBLICATIONS

Gou, Yang et al.; Research on Broadband Impedance Matching Technique of Acoustic Logging Piezoelectric Transducer; Technical Acoustics; vol. 38, No. 1, Feb. 2019; 1000-3630(2019)-01-0113-06.

* cited by examiner

*Primary Examiner* — Robert J Pascal
*Assistant Examiner* — Jorge L Salazar, Jr.
(74) *Attorney, Agent, or Firm* — Novick, Kim & Lee, PLLC; Allen Xue (57) ABSTRACT

A sonic logging broadband impedance matching transformer modular design method and a module are related to sonic logging. The method includes the steps: obtaining component values of a multimodal equivalent circuit of a piezoelectric transducer by fitting actual impedance data of the piezoelectric transducer through a nonlinear regression method; selecting a T-type network structure composed of a matching capacitor and a matching inductor as a piezoelectric transducer impedance matching network structure; and presetting a to-be-matched frequency band and a reflection coefficient, and taking the multimodal equivalent circuit of the transducer as an artificial circuit load to optimize parameters of the piezoelectric transducer impedance matching network structure and a boosting transformer together so as to obtain final optimized parameters of the piezoelectric

(Continued)

transducer impedance matching network structure and the transformer.

15 Claims, 5 Drawing Sheets

(58) Field of Classification Search
USPC .................. 333/124, 33, 186–188, 193–196
See application file for complete search history.

Prior Art

SONIC LOGGING BROADBAND IMPEDANCE MATCHING TRANSFORMER MODULAR DESIGN METHOD AND MODULE

FIELD

The present disclosure belongs to the technical field of sonic logging in oil exploration, and particularly relates to a sonic logging broadband impedance matching transformer modular design method and module.

BACKGROUND

Sonic logging is one of the necessary means to obtain geological data in the oil exploration and development stage, a transmitting transformer is the core component of a sonic logging instrument transmission system, and the quality of high-voltage excitation signals, transmitted by the transmitting transformer to a transducer and the working frequency bandwidth of the transducer directly determine the quality of logging signals. Different formations often have different natural frequencies. Only when the excitation frequency of the transducer is close to the natural frequencies and the power is high enough will larger formation signals be measured. In terms of widening the frequency band, due to the constraints of the logging instrument space, the main transducer frequency bandwidth adopted during actual sonic logging is very narrow, so different transducers need to be installed according to different geological applications, for example, a Halliburton's well-around sonic scanner adopts three transducers with different center frequencies to achieve broadband excitation. In terms of power improvement, the transformer is an indispensable key device, can raise the alternating voltage of several hundred volts output by an exciting circuit to thousands of volts to meet the excitation requirements of the transducer. However, even if the transducer is excited at the main frequency, there still is a very high reactive component, which requires impedance matching to increase the active power. The current impedance matching technology of a sonic logging transducer is narrow-band matching technology, which counteracts the reactive component of the transducer by adding a compensating inductor at the primary of the transformer, and adjusting the transformer turns ratio to change the resistance, thereby achieving the purpose of impedance matching.

With the continuous development of unconventional oil and gas field exploration in China, in the face of unconventional reservoirs with more complex geological environments, it is increasingly urgent to optimize and upgrade sonic logging instruments. Aiming at high signal-to-noise ratio and diversification of instrument working modes, the high-power broadband transducer excitation technology is the technical difficulty currently. For the problem of wide frequency bands, most of existing technologies adopt multiple different main frequency transducers to form a transmitting array to achieve the purpose of broadband excitation, which undoubtedly increases the difficulty and cost of instrument design, and switching operation of the multiple transducers also increases the instrument failure rate. For the power increase problem, a current method of series connection of a compensating inductor at the primary of the transformer can only achieve the effect of narrow-band matching. The inductance value is calculated based on the average value of the impedance of transducer array excitation frequency points, which is not the optimal solution, and a current matching technology inductance value calculation process is cumbersome and complicated. Since an exciting circuit belongs to a switching power supply circuit, the transformer secondary current value is high, which makes a compensation inductor relatively large in size and is not conducive to instrument circuit tooling. Therefore, it is of great practical significance to propose modular design of the sonic logging impedance matching transformer. Combining the impedance matching network design with the transformer parameters for modular design can not only broaden the working frequency band of the transducer, increase the exciting power, but also solve the instrument circuit tooling problems.

However, for existing transformers and impedance matching design, only power increase is considered, but the problem of interference signals in excitation signals when transducer parameters are coupled with transformer coils is not considered, single inductance impedance matching has a poor filtering effect on the SPWM (sinusoidal pulse width modulation) excitation signals, a time domain waveform will be distorted, tops of the waveform will be truncated and concave, and interference signals with the similar amplitude as the excitation signals are generated from the spectrum analysis.

SUMMARY

In order to solve the above technical problems, the object of the present disclosure is to provide a sonic logging broadband impedance matching transformer modular design method and module for a sonic logging transducer which can broaden the operating frequency bandwidth and transmission power of the transducer.

The technical solution of the present disclosure is as follows: a sonic logging broadband impedance matching transformer modular design method. The method specifically includes the following steps:

S1) obtaining component values of a multimodal equivalent circuit of a piezoelectric transducer by fitting actual impedance data of the piezoelectric transducer through a nonlinear regression method;

S2) selecting a T-type network structure composed of a matching capacitor and a matching inductor as a piezoelectric transducer impedance matching network structure; and S3) taking the piezoelectric transducer impedance matching network structure obtained in S2) as an artificial circuit load to optimize parameters of the piezoelectric transducer impedance matching network structure and a boosting transformer together so as to obtain final optimized parameters of the piezoelectric transducer impedance matching network structure and the boosting transformer, and designing a sonic logging broadband impedance matching transformer module according to the obtained parameters.

Further, the S1) specifically includes: the specific process:

S1.1) testing the actual impedance data of the piezoelectric transducer with an impedance analyzer, and putting the impedance data into the following formula (1), the formula is as follows:

$$Y = j\omega C_0 + \sum_{i=1}^{n} \left( R_i + j\omega L_i + \frac{1}{j\omega C_i} \right)^{-1}, \quad (1)$$

wherein, Y represents the modulus of admittance of a piezoelectric transducer, $C_0$ represents static capacitance in a piezoelectric transducer equivalent circuit, w represents the angular frequency, $R_i$ represents dynamic resistance corresponding to each of resonance modes, L represents dynamic inductance corresponding to each of the modes, $C_i$ represents dynamic capacitance corresponding to each of the modes, j represents a complex number, and i represents the number of piezoelectric transducer modes and is an integer greater than 0; and S1.2) fitting parameter values of the transducer equivalent circuit by the inverse solution of the formula (1) in S1.1), namely the static capacitance value $C_0$ in the piezoelectric transducer equivalent circuit, dynamic resistance values R corresponding to each of resonance modes, dynamic inductance values $L_i$ corresponding to each of the modes, and dynamic capacitance values $C_i$ corresponding to each of the modes.

Further, the S2) specifically includes the steps:

S2.1) determining a frequency point of a to-be-matched frequency; and

S2.2) taking an impedance value of the piezoelectric transducer at the frequency point as a load, and taking output resistance of an exciting circuit as signal source internal resistance to obtain the T-type network structure composed of the capacitor and the inductor as the impedance matching network structure.

Further, the S3) specifically includes the steps:

S3.1) setting a reflection coefficient to be less than −20 dB, and selecting the frequency ranging from 10 KHz to 16 KHz according to the piezoelectric transducer impedance matching network structure obtained in S2);

S3.2) setting the capacitance value, the inductance value and the transformation ratio of the boosting transformer in the piezoelectric transducer impedance matching network to dynamic debugging according to the parameters set in S3.1), and obtaining an optimized transformation ratio of the boosting transformer and component parameter values of the piezoelectric transducer impedance matching network through a Hybird algorithm; and S3.3) determining the number of primary turns $N_1$ of the boosting transformer according to the following formula (2) based on the transformation ratio of the boosting transformer determined in S3.2), the formula is as follows:

$$N_1 = \frac{U_1}{fBSK}, \quad (2)$$

wherein, $U_1$ represents direct voltage of an exciting circuit high-voltage module, f represents the average frequency of the selected frequency band, B represents the magnetic induction intensity of a transformer core, S represents the cross-sectional area of the transformer core, and k represents a coupling coefficient. When the winding wire diameter of the boosting transformer is 0.3 mm, k=0.8, and when the winding wire diameter of the boosting transformer is 0.2 mm, k=0.9.

Further, the transformation ratio of the boosting transformer in S3.2) ranges from: 1:5 to 1:10.

Further, the capacitance in S3.2) is 20 nF-150 nF, and the inductance value is 3 mH-6 mH.

Another object of the present disclosure is to provide a module designed by adopting the above method, the module includes a boosting transformer and an impedance matching network circuit, the boosting transformer is used for adjusting the ratio of piezoelectric transducer equivalent resistance to exciting circuit output resistance and increasing excitation voltage; and the impedance matching network circuit is used for adjusting the difference between impedances of a piezoelectric transducer and impedances of an exciting circuit and the transformer, reducing capacitive reactance of a load system, and increasing active power.

Wherein, one end of the boosting transformer is connected to the transducer through the impedance matching network circuit, and the other end of the boosting transformer is connected to the exciting circuit.

Further, the impedance matching network circuit includes a matching capacitor and a matching inductor. The matching capacitor is connected to a secondary of the boosting transformer in parallel. One end of the matching inductor is connected to the capacitor, and the other end of the matching inductor is connected to the positive electrode of the piezoelectric transducer.

The exciting circuit includes a half-bridge exciting circuit, a full-bridge exciting circuit or a positive and negative high-voltage pulse exciting circuit implemented with a tapped transformer.

Further, the module can change the frequency bandwidth of the piezoelectric transducer to 10 KHZ-16 KHz, and the frequency band is broadened by 3.5 times.

The present disclosure has the beneficial effects: by adopting the above technical solutions, the present disclosure has the following characteristics:

Through the impedance matching transformer modular design method, the present disclosure has the following advantages:

1. broadband excitation of the transducer is achieved in a real sense, and the problems of narrow transducer impedance matching frequency band and a complicated calculation process at present are solved.

2. the module can adopt a half-bridge exciting circuit, a full-bridge exciting circuit or a positive and negative high-voltage pulse exciting circuit implemented with a tapped transformer, broadband excitation of a single transducer is achieved through impedance matching, and the active power of the transducer is effectively increased.

3. the impedance matching network of the piezoelectric transducer is combined with the parameter design of the transformer, and devices are integrated into the same shell for modularization, and great convenience is brought to instrument tooling.

The module can adopt the half-bridge exciting circuit, the full-bridge exciting circuit or the positive and negative high-voltage pulse exciting circuit implemented with the tapped transformer, broadband excitation of the single transducer is achieved through impedance matching, the power is increased, and instrument tooling is facilitated as well.

DETAILED DESCRIPTION OF THE EMBODIMENTS

In order to make the above objects, features and advantages of the present disclosure more obvious and understandable, the present disclosure will be further described below in conjunction with the drawings.

Figure 2:
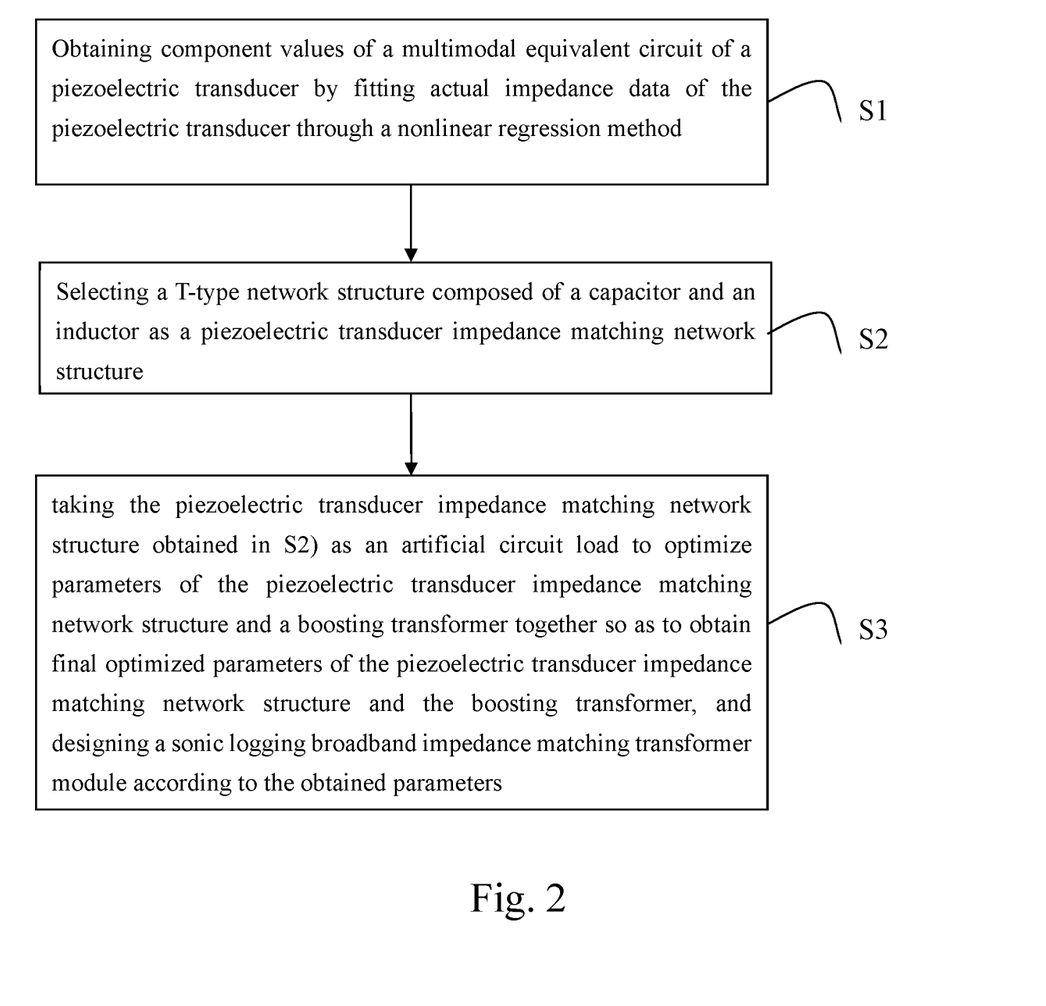
FIG. 2 is a flow block diagram of a sonic logging broadband impedance matching transformer modular design method according to the present disclosure.

As shown in FIG. 2, the present disclosure provides a sonic logging broadband impedance matching transformer modular design method. The method specifically includes the following steps:

S1) obtaining component values of a multimodal equivalent circuit of a piezoelectric transducer by fitting actual impedance data of the piezoelectric transducer through a nonlinear regression method;

S2) selecting a T-type network structure composed of a capacitor and an inductor as a piezoelectric transducer impedance matching network structure; and S3) taking the piezoelectric transducer impedance matching network structure obtained in S2) as an artificial circuit load to optimize parameters of the piezoelectric transducer impedance matching network structure and a boosting transformer together so as to obtain final optimized parameters of the piezoelectric transducer impedance matching network structure and the boosting transformer, and designing a sonic logging broadband impedance matching transformer module according to the obtained parameters.

The S1) specifically includes: the specific process:

S1.1) testing the actual impedance data of the piezoelectric transducer with an impedance analyzer, and putting the impedance data into the following formula (1), the formula is as follows:

$$Y = j\omega C_0 + \sum_{i=1}^{n}\left(R_i + j\omega L_i + \frac{1}{j\omega C_i}\right)^{-1}, \quad (1)$$

wherein, Y represents the modulus of admittance of a piezoelectric transducer, $C_0$ represents static capacitance in a piezoelectric transducer equivalent circuit, $\omega$ represents the angular frequency, R represents dynamic resistance corresponding to each of resonance modes, $L_i$ represents dynamic inductance corresponding to each of the modes, $C_i$ represents dynamic capacitance corresponding to each of the modes, j represents a complex number, and i represents the number of piezoelectric transducer modes and is an integer greater than 0; and S1.2) fitting parameter values of the transducer equivalent circuit by the inverse solution of the formula (1) in S1.1), namely the static capacitance value $C_0$ in the piezoelectric transducer equivalent circuit, dynamic resistance values R corresponding to each of resonance modes, dynamic inductance values $L_i$ corresponding to each of the modes, and dynamic capacitance values $C_i$ corresponding to each of the modes.

The S2) specifically includes the steps:

S2.1) determining a frequency point of a to-be-matched frequency; and

Figure 3:
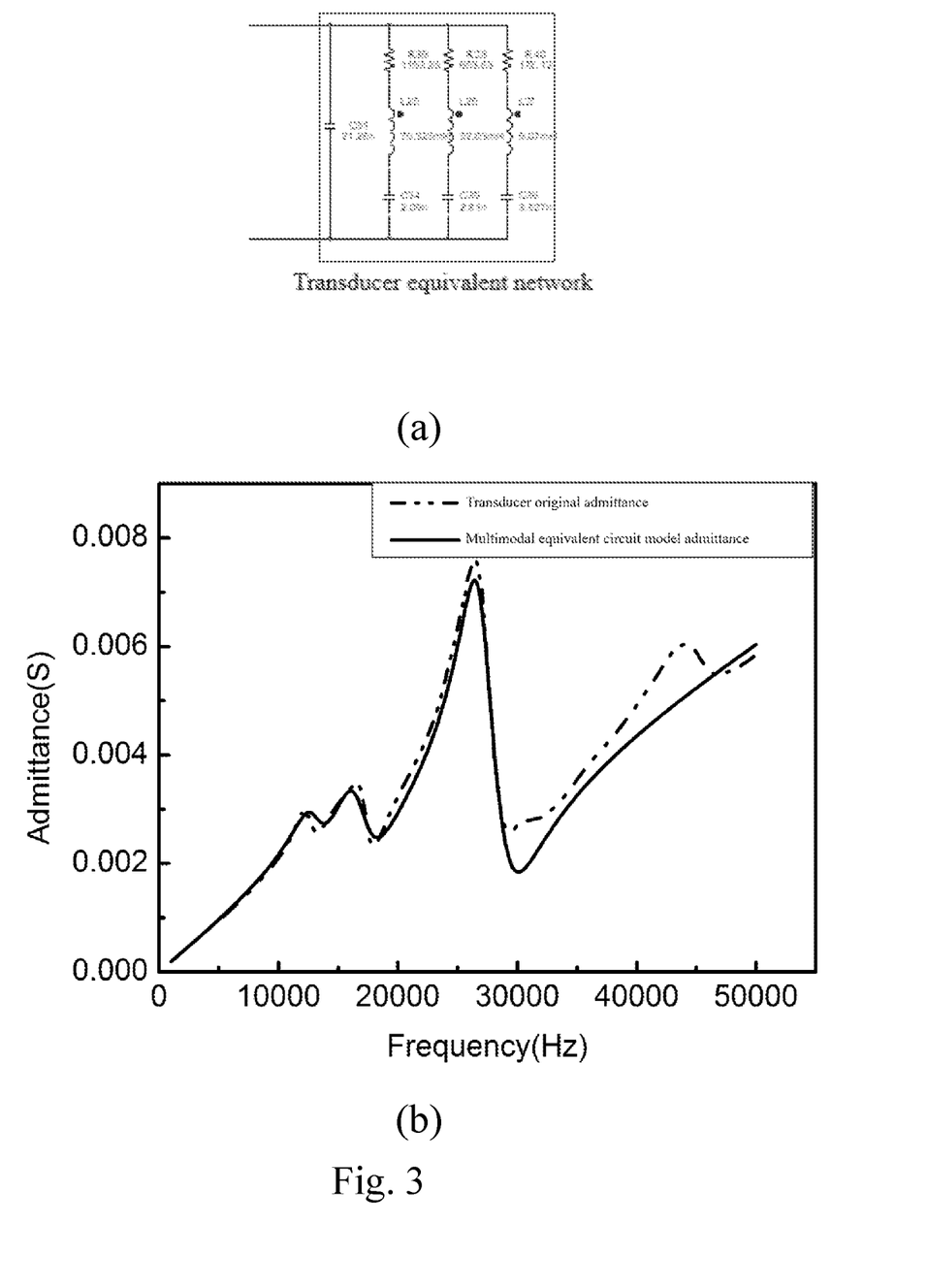
FIG. 3 is a schematic diagram of a piezoelectric transducer equivalent circuit model and an admittance curve of a sonic logging broadband impedance matching transformer modular design method according to the present disclosure. (a) is a schematic diagram of a multimodal equivalent circuit model of a piezoelectric transducer, and (b) is a schematic diagram of a multimodal equivalent circuit admittance curve.

S2.2) taking an impedance value of the piezoelectric transducer at the frequency point as a load, and taking output resistance of an exciting circuit as signal source internal resistance to obtain the T-type network structure composed of the capacitor and the inductor as the impedance matching network structure, as shown in the FIG. 3.

The S3) specifically includes the steps:

S3.1) setting a reflection coefficient to be less than −20 dB, and selecting the frequency ranging from 10 KHz to 16 KHz according to the piezoelectric transducer impedance matching network structure obtained in S2);

S3.2) setting the capacitance value, the inductance value and the transformation ratio of the boosting transformer in the piezoelectric transducer impedance matching network to dynamic debugging according to the parameters set in S3.1), and obtaining an optimized transformation ratio of the boosting transformer and component parameter values of the piezoelectric transducer impedance matching network through a Hybird algorithm; and S3.3) determining the number of primary turns $N_1$ of the boosting transformer according to the following formula (2) based on the transformation ratio of the boosting transformer determined in S3.2), the formula is as follows:

$$N_1 = \frac{U_1}{fBSK}, \quad (2)$$

wherein, $U_1$ represents direct voltage of an exciting circuit high-voltage module, f represents the average frequency of the selected frequency band, B represents the magnetic induction intensity of a transformer core, S represents the cross-sectional area of the transformer core, and k represents a coupling coefficient. When the winding wire diameter of the boosting transformer is 0.3 mm, k=0.8, and when the winding wire diameter of the boosting transformer is 0.2 mm, k=0.9.

The transformation ratio of the boosting transformer in S3.2) ranges from: 1:5 to 1:10.

The capacitance in S3.2) is 20 nF-150 nF, and the inductance value is 3 mH-6 mH.

Figure 4:
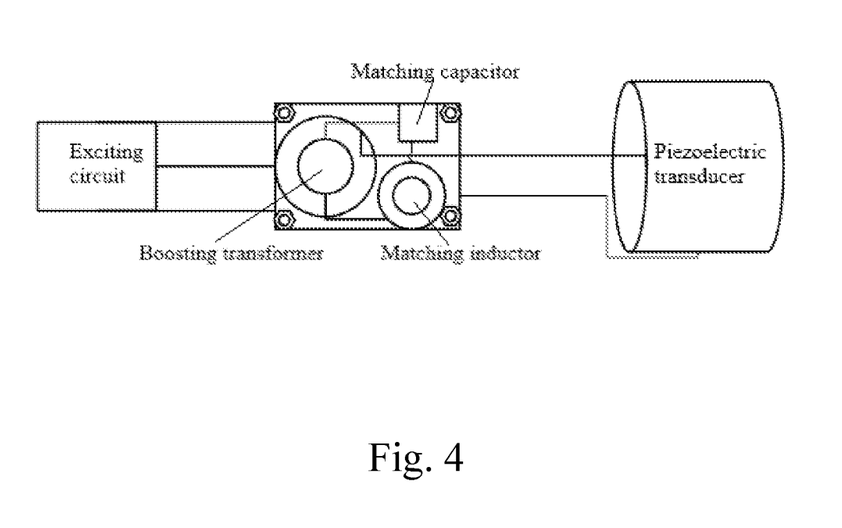
FIG. 4 is a schematic structural diagram of a module obtained through adopting a sonic logging broadband impedance matching transformer modular design method according to the present disclosure.

Another object of the present disclosure is to provide a module designed by adopting the above method, the module includes a transformer and an impedance matching network circuit, the boosting transformer is used for adjusting the ratio of transducer equivalent resistance to exciting circuit output resistance and increasing the excitation voltage; and the impedance matching network circuit is used for adjusting the difference between impedances of a piezoelectric transducer and impedances of an exciting circuit and the transformer, reducing the capacitive reactance of a load system, and increasing active power.

Wherein, one end of the transformer is connected to the transducer through the impedance matching network circuit, and the other end of the transformer is connected to the exciting circuit, as shown in FIG. 4.

The impedance matching network circuit includes a matching capacitor and a matching inductor. The capacitor is connected to the secondary of the boosting transformer in parallel. One end of the inductor is connected to the capacitor, and the other end of the inductor is connected to the positive electrode of the piezoelectric transducer.

The exciting circuit includes a half-bridge exciting circuit, a full-bridge exciting circuit or a positive and negative high-voltage pulse exciting circuit implemented with a tapped transformer.

The module can change the frequency bandwidth of the piezoelectric transducer to 10 KHZ-16 KHz, and the frequency band is broadened by 3.5 times.

Embodiment

Figure 1:
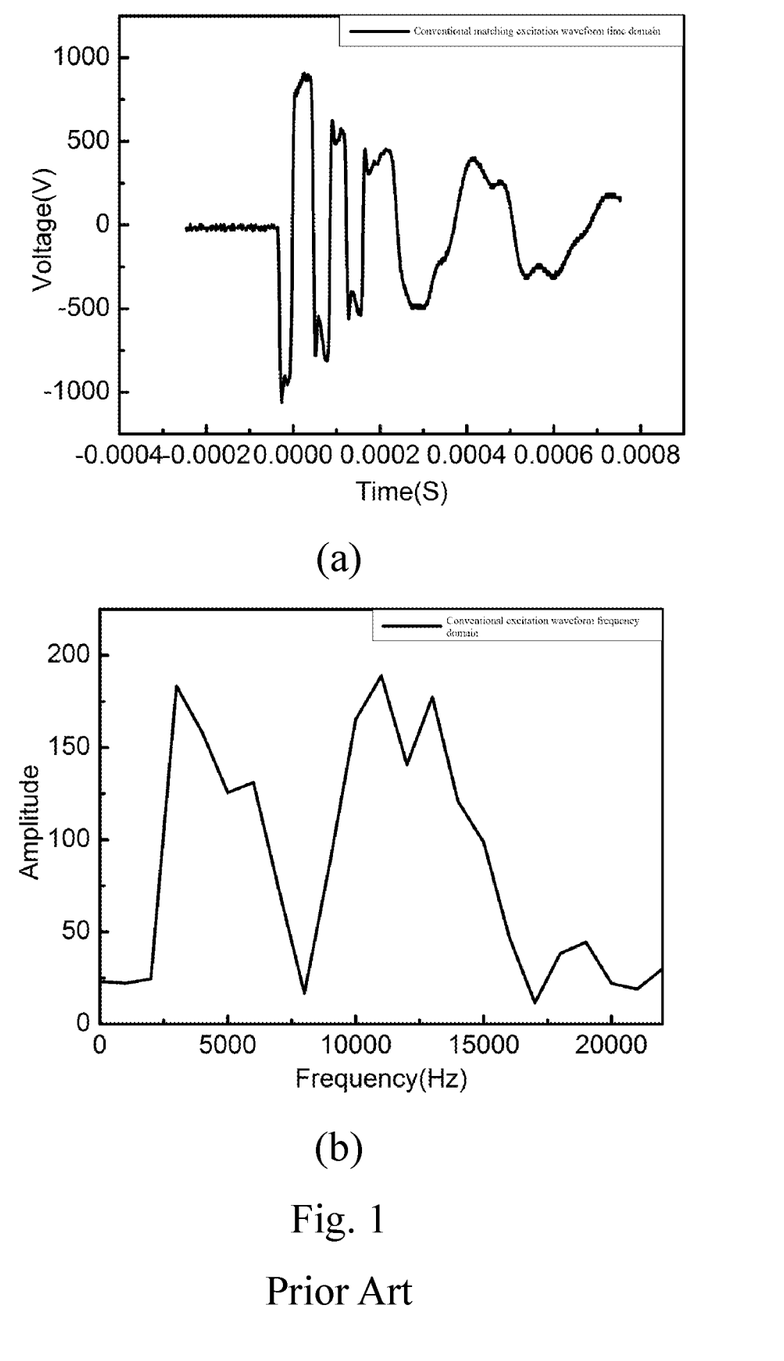
FIG. 1 shows schematic diagrams of conventional single inductance impedance matching excitation waveforms. (a) Time domain waveform of conventional single inductance impedance matching excitation; and (b) Frequency domain waveform of conventional single inductance impedance matching excitation.

Impedance analysis data of the transducer are obtained through an impedance analyzer at first, and a multimodal equivalent circuit of the transducer is obtained by nonlinear regression fitting. Impedance data are fitted through a nonlinear regression method according to the formula:

$$Y = j\omega C_0 + \sum_{i=1}^{n}\left(R_i + j\omega L_i + \frac{1}{j\omega C_i}\right)^{-1}, \quad (1)$$

wherein, Y represents the modulus of admittance of a piezoelectric transducer, $C_0$ represents static capacitance in a piezoelectric transducer equivalent circuit, $\omega$ represents the angular frequency, R represents dynamic resistance corresponding to each of resonance modes, $L_i$ represents dynamic inductance corresponding to each of the modes, $C_i$ represents dynamic capacitance corresponding to each of the modes, j represents a complex number, i represents the number of transducer modes from 1 to n, and the fitted $C_0$, $R_i$, $L_i$, $C_i$ are equivalent circuit component values of the transducer. The impedance analyzer measured that the transducer adopted in the embodiment has 3 modes in the required frequency band. In the equivalent circuit obtained after fitting, $C_0$ is 21.28 nF, $R_1$ is 1193Ω, $R_2$ is 653.63Ω, $R_3$ is 172.12Ω, $C_1$ is 2.09 nF, $C_2$ is 2.81 nF, $C_3$ is 3.8 nF, $L_1$ is 70.9 mH, $L_2$ is 30.03 mH, and $L_3$ is 9.07 mH. As shown in FIG. 1, an equivalent circuit admittance formed by the obtained component parameters is in goodness of fit with an original transducer admittance.

It is planned to perform broadband impedance matching at 10 KHz-16 KHz. An impedance matching network structure is designed according to impedance data of the transducer at 13 KHz. A T-type inductor-capacitor network is adopted. The DC-DC voltage of the exciting circuit is measured to be 200 V, and the output impedance is 8.5Ω. According to the expected excitation voltage of 2000 V (peak-to-peak value), the transformation ratio of the transformer is set at 1:5-1:10, and the port reflection coefficient is less than −20 dB. A multimodal equivalent circuit is adopted as a load for optimizing parameters of the impedance matching network and the transformer through a Hybird algorithm, and the calculated matching capacitance is 64 nF, the matching inductance is 4 mH, and the transformation ratio of the transformer is 1:8. The number of turns of the transformer is determined by the formula:

$$N_1 = \frac{U_1}{fBSK}, \quad (2)$$

$N_1$ represents the number of primary turns of the transformer, $U_1$ represents direct voltage of an exciting circuit high-voltage module, f represents the average frequency of the selected frequency band, B represents the magnetic induction intensity of a transformer core, S represents the cross-sectional area of the transformer core, and k represents the coupling coefficient. When the winding wire diameter of the transformer is 0.2 mm, k is 0.9, the direct voltage of the high-voltage module in the embodiment is 200 V, the average frequency of the frequency band is 13 kHz, the magnetic induction intensity of the core is 1.5 T, the cross-sectional area of the core is 96 mm$^2$, the coupling coefficient is 0.9, the calculated number of primary turns of the transformer is 118, and the number of secondary turns is 944.

Figure 5:
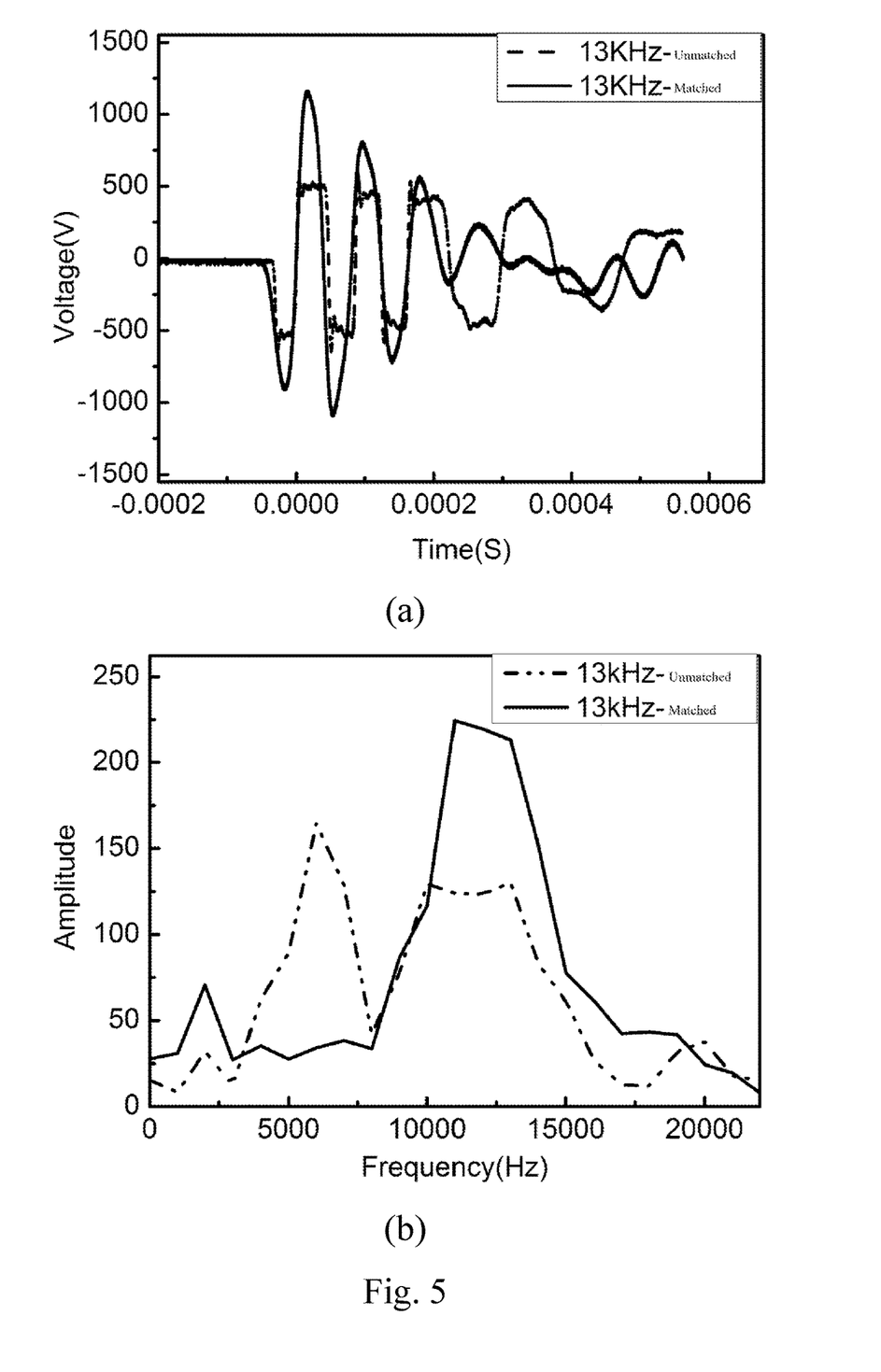
FIG. 5 shows schematic diagrams of excitation waveforms before and after 13 kHz matching according to embodiments of the present disclosure. (a) Time domain diagram of excitation waveforms before and after 13 KHz matching; (b) Frequency domain diagram of excitation waveforms before and after 13 kHz matching.

According to the parameters obtained by circuit simulation, an actual impedance matching transformer module is manufactured for experiments as shown in FIG. 4, the actual effect of the module is evaluated by observing the frequency band ranging from 8 KHz to 17 Khz and adding the active power of the impedance matching transformer module designed by the present disclosure and a single transformer excitation transducer. As shown in Table 1, if the half power point is used as the boundary and the data are normalized, the transducer bandwidth is only 12 KHz-13 KHz before the module is added. After the module designed by the present disclosure is added, the frequency bandwidth becomes 10 KHZ-16 KHz, the frequency band is broadened by 3.5 times, and the active power is greatly increased. As shown in FIG. 5, taking the waveform at 13 KHz for analysis, it can be seen that when the module is not added, not only is the excitation waveform seriously distorted and the amplitude low, but also an interference frequency is coupled out in the low frequency band, after the impedance matching transformer module is added, the interference frequency is filtered out, and the waveform quality and amplitude are greatly improved. The working frequency band and active power of the transducer used for sonic logging can be effectively increased, the modular design is beneficial to actual tooling, and the instrument performance can be effectively improved.

TABLE 1

| Experimental measurements | | | | |
|---|---|---|---|---|
| Frequency (KHz) | Unmatched (W) | Unmatched-normalized | Matched (W) | Matched-normalized |
| 8 | 12.04 | 0.099 | 25.77 | 0.104 |
| 9 | 18.89 | 0.156 | 49.71 | 0.200 |
| 10 | 30.83 | 0.256 | 128.75 | 0.518 |
| 11 | 45.45 | 0.377 | 185.75 | 0.748 |
| 12 | 100.93 | 0.837 | 201.53 | 0.811 |
| 13 | 120.56 | 1 | 248.43 | 1 |
| 14 | 56.54 | 0.469 | 180.56 | 0.727 |
| 15 | 21.33 | 0.177 | 140.27 | 0.564 |
| 16 | 14.56 | 0.121 | 125.36 | 0.504 |
| 17 | 8.45 | 0.070 | 80.77 | 0.325 |

The sonic logging broadband impedance matching transformer modular design method and module provided by the embodiments of the present disclosure are described in detail above. The descriptions of the above embodiments are only used to help understand the method of the present disclosure and the core idea thereof; and meanwhile, those of ordinary skilled in the art may make variations to the specific implementation manner and application scope based on the ideas of the present disclosure, and in summary, the content of the description should not be understood as a limitation of the present disclosure.

If certain words are used in the description and claims to refer to specific components, hardware manufacturers may use different terms to refer to the same component. The description and claims do not use differences in names as a way to distinguish components, but rather differences in functions of components as criteria for distinguishing. As mentioned in the entire description and claims, "comprise" and "include" are open-ended terms and so should be interpreted as "comprising/including but not limited to". "Roughly" means that within the acceptable error range, those skilled in the art can solve the technical problem within a certain error range and basically achieve the technical effect. The subsequent description of the description is preferred embodiments for implementing the present disclosure, but the description is for the purpose of illustrating the general principles of the present disclosure and is not intended to limit the scope of the present disclosure. The scope of protection of the present disclosure shall be deemed as defined in the appended claims.

It should also be noted that the terms "comprise", "include" or any other variants thereof are intended to cover non-exclusive inclusions, so that a commodity or system that includes a series of elements includes not only those elements, but also those not explicitly listed or other elements that are inherent to this commodity or system. Without more restrictions, the elements defined by the sentence "include a . . . " do not exclude that there are other identical elements in the commodity or system that includes the elements.

It should be understood that the term "and/or" used herein is merely an association relationship describing associated objects and indicates that there may be three relationships, for example, A and/or B may indicate the three cases: A exists alone, A and B coexist, and B exists alone. In addition, the character "/" generally indicates that associated objects before and after the character are in an "alternative" relationship herein.

The above description shows and describes several preferred embodiments of the present disclosure, but as mentioned above, it should be understood that the present disclosure is not limited to the forms disclosed herein, and should not be considered as an exclusion from other embodiments, but can be used in various other combinations, modifications and environments, and can be modified within the scope of the inventive concept described herein by the above teachings or techniques or knowledge in related fields. Modifications and variations made by those skilled in the art without departing from the spirit and scope of the present disclosure shall fall within the scope of protection of the claims appended to the present disclosure.

The invention claimed is:

1. A sonic logging broadband impedance matching transformer modular design method, comprising:
   S1) obtaining component values of an equivalent circuit of a piezoelectric transducer having a plurality of resonance modes by fitting actual impedance data of the piezoelectric transducer using a nonlinear regression method;
   S2) selecting a T-type network structure comprising a matching capacitor and a matching inductor as a piezoelectric transducer impedance matching network structure; and
   S3) taking the piezoelectric transducer impedance matching network structure obtained in S2) as an artificial circuit load to optimize parameters of the piezoelectric transducer impedance matching network structure and a boosting transformer together so as to obtain optimized parameters of the piezoelectric transducer impedance matching network structure and the boosting transformer, and designing a sonic logging broadband impedance matching transformer module according to the optimized parameters.

2. The method according to claim 1, wherein S1) further comprises:
   S1.1) measuring the actual impedance data of the piezoelectric transducer with an impedance analyzer, and inputting the actual impedance data into formula (I), $$Y = j\omega C_0 + \sum_{i=1}^{n}\left(R_i + j\omega L_i + \frac{1}{j\omega C_i}\right)^{-1}, \quad (I)$$

wherein, Y represents a modulus of admittance of the piezoelectric transducer, $C_0$ represents a static capacitance in the piezoelectric transducer equivalent circuit, $\omega$ represents an angular frequency, $R_i$ represents a dynamic resistance corresponding to one of the plurality of resonance modes, $L_i$ represents a dynamic inductance corresponding to one of the plurality of resonance modes, $C_i$ represents a dynamic capacitance corresponding to one of the plurality of resonance modes, j represents a complex number, and i represents a number of piezoelectric transducer modes, and is an integer greater than 0; and
   S1.2) obtaining values of the parameters of the piezoelectric transducer equivalent circuit by solving the formula (I) in S1.1 using nonlinear regression, wherein the parameters are selected from the static capacitance value $C_0$, the dynamic resistance values $R_i$, the dynamic inductance values $L_i$, and the dynamic capacitance values $C_i$.

3. The method according to claim 2, wherein S2 comprises:
   S2.1) determining a frequency point of a to-be-matched frequency; and
   S2.2) taking an impedance value of the piezoelectric transducer at the frequency point as a load, and taking an output resistance of an exciting circuit as signal source internal resistance to obtain the T-type network structure.

4. The method according to claim 3, wherein S3 comprises:
   S3.1) setting a reflection coefficient to be less than −20 dB, and selecting a frequency in the range of 10 KHz to 16 KHz according to the piezoelectric transducer impedance matching network structure obtained in S2;
   S3.2) setting the capacitance value, an inductance value, and a transformation ratio of the boosting transformer in the piezoelectric transducer impedance matching network as variables to obtain an optimized transformation ratio of the boosting transformer and optimized component parameter values of the piezoelectric transducer impedance matching network through a Hybird algorithm; and
   S3.3) determining a number of primary turns N1 of the boosting transformer according to formula (II) based on the transformation ratio of the boosting transformer determined in S3.2, $$N_1 = \frac{U_1}{fBSK},\quad\text{(II)}$$

wherein, $U_1$ represents a direct voltage of an exciting circuit high-voltage module, f represents an average frequency of a selected frequency band, B represents a magnetic induction intensity of a transformer core, S represents a cross-sectional area of a transformer core, and k represents a coupling coefficient; when a winding wire diameter of the boosting transformer is 0.3 mm, k=0.8, and when the winding wire diameter of the boosting transformer is 0.2 mm, k=0.9.

5. The method according to claim 4, wherein the transformation ratio of the boosting transformer in S3.2 ranges from 1:5 to 1:10.

6. The method according to claim 4, wherein the capacitance in S3.2 is 20 nF to 150 nF, and the inductance value is 3 mH to 6 mH.

7. A module designed by the method according to claim 1, wherein the module comprises the boosting transformer and the impedance matching network circuit,
the boosting transformer is a ratio of piezoelectric transducer equivalent resistance to an output resistance of an exciting circuit and increasing an excitation voltage; and
the impedance matching network circuit is configured to adjust a difference between an impedance of a piezoelectric transducer and an impedance of the exciting circuit and the boosting transformer, reducing a capacitive reactance of a load system, and increasing active power,
wherein, a first end of the boosting transformer is connected to the piezoelectric transducer through the impedance matching network circuit, and a second end of the boosting transformer is connected to the exciting circuit.

8. The module according to claim 7, wherein the impedance matching network circuit comprises the matching capacitor and the matching inductor, the matching capacitor is connected to a secondary of the boosting transformer in parallel, a first end of the matching inductor is connected to the matching capacitor, and a second end of the matching inductor is connected to a positive electrode of the piezoelectric transducer.

9. The module according to claim 7, wherein the exciting circuit comprises a half-bridge exciting circuit, a full-bridge exciting circuit, or a positive and negative high-voltage pulse exciting circuit implemented with a tapped transformer.

10. The module according to claim 7, wherein the module is configured to change a frequency bandwidth of the piezoelectric transducer to 10 KHZ-16 KHz, and to broaden a frequency band by 3.5 times.

11. A module designed by the method according to claim 2, wherein the module comprises the boosting transformer and the impedance matching network circuit,
the boosting transformer is configured to adjust a ratio of piezoelectric transducer equivalent resistance to an output resistance of an exciting circuit and increasing an excitation voltage; and
the impedance matching network circuit is configured to adjust a difference between an impedance of a piezoelectric transducer and an impedance of the exciting circuit and the boosting transformer, reducing a capacitive reactance of a load system, and increasing active power,
wherein, a first end of the boosting transformer is connected to the piezoelectric transducer through the impedance matching network circuit, and a second end of the boosting transformer is connected to the exciting circuit.

12. A module designed by the method according to claim 3, wherein the module comprises the boosting transformer and the impedance matching network circuit,
the boosting transformer is configured to adjust a ratio of piezoelectric transducer equivalent resistance to an output resistance of an exciting circuit and increasing an excitation voltage; and
the impedance matching network circuit is configured to adjust a difference between an impedance of a piezoelectric transducer and an impedance of the exciting circuit and the boosting transformer, reducing a capacitive reactance of a load system, and increasing active power,
wherein, a first end of the boosting transformer is connected to the piezoelectric transducer through the impedance matching network circuit, and a second end of the boosting transformer is connected to the exciting circuit.

13. A module designed by the method according to claim 4, wherein the module comprises the boosting transformer and the impedance matching network circuit,
the boosting transformer is configured to adjust a ratio of piezoelectric transducer equivalent resistance to an output resistance of an exciting circuit and increasing an excitation voltage; and
the impedance matching network circuit is configured to adjust a difference between an impedance of a piezoelectric transducer and an impedance of the exciting circuit and the boosting transformer, reducing a capacitive reactance of a load system, and increasing active power,
wherein, a first end of the boosting transformer is connected to the piezoelectric transducer through the impedance matching network circuit, and a second end of the boosting transformer is connected to the exciting circuit.

14. A module designed by the method according to claim 5, wherein the module comprises the boosting transformer and the impedance matching network circuit,
the boosting transformer is configured to adjust a ratio of piezoelectric transducer equivalent resistance to an output resistance of an exciting circuit and increasing an excitation voltage; and
the impedance matching network circuit is configured to adjust a difference between an impedance of a piezoelectric transducer and an impedance of the exciting circuit and the boosting transformer, reducing a capacitive reactance of a load system, and increasing active power,
wherein, a first end of the boosting transformer is connected to the piezoelectric transducer through the impedance matching network circuit, and a second end of the boosting transformer is connected to the exciting circuit.

15. A module designed by the method according to claim 6, wherein the module comprises the boosting transformer and the impedance matching network circuit,
the boosting transformer is configured to adjust a ratio of piezoelectric transducer equivalent resistance to an output resistance of an exciting circuit and increasing an excitation voltage; and the impedance matching network circuit is configured to adjust a difference between an impedance of a piezoelectric transducer and an impedance of the exciting circuit and the boosting transformer, reducing a capacitive reactance of a load system, and increasing active power, wherein, a first end of the boosting transformer is connected to the piezoelectric transducer through the impedance matching network circuit, and a second end of the boosting transformer is connected to the exciting circuit.

\* \* \* \* \*